(12) United States Patent
Abukawa et al.

(10) Patent No.: US 9,153,617 B2
(45) Date of Patent: Oct. 6, 2015

(54) IMAGING APPARATUS, AND IMAGING SYSTEM

(71) Applicant: CANON KABUSHIKI KAISHA, Tokyo (JP)

(72) Inventors: Kotaro Abukawa, Hiratsuka (JP); Itsutaku Sano, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 148 days.

(21) Appl. No.: 14/075,116

(22) Filed: Nov. 8, 2013

(65) Prior Publication Data
US 2014/0131556 A1    May 15, 2014

(30) Foreign Application Priority Data
Nov. 12, 2012    (JP) ................................. 2012-248310

(51) Int. Cl.
| | |
|---|---|
| *G01J 1/42* | (2006.01) |
| *H01L 27/00* | (2006.01) |
| *H03F 3/08* | (2006.01) |
| *H01L 27/146* | (2006.01) |
| *H01L 31/00* | (2006.01) |

(52) U.S. Cl.
CPC .... *H01L 27/14636* (2013.01); *H01L 27/14603* (2013.01); *H01L 27/14609* (2013.01); *H01L 31/00* (2013.01)

(58) Field of Classification Search
CPC ... H01L 27/146; H01L 7/14601; H01L 31/00; H01L 33/00; H04N 5/217; H04N 5/335
USPC .................... 250/208.1, 208.2, 214.1, 214 R; 348/301, 308, 294, 299; 257/431, 444, 257/451, 458; 438/6, 7, 48
See application file for complete search history.

(56) References Cited

U.S. PATENT DOCUMENTS

| | | | | |
|---|---|---|---|---|
| 6,352,869 | B1 * | 3/2002 | Guidash | 438/16 |
| 7,767,952 | B2 * | 8/2010 | Ohkawa | 250/208.1 |
| 2006/0044439 | A1 * | 3/2006 | Hiyama et al. | 348/308 |
| 2006/0175536 | A1 * | 8/2006 | Kim et al. | 250/208.1 |
| 2012/0314109 | A1 * | 12/2012 | Murakami et al. | 348/300 |

FOREIGN PATENT DOCUMENTS

JP    2010-206172 A    9/2010

* cited by examiner

*Primary Examiner* — Georgia Y Epps
*Assistant Examiner* — Vildana Hodzic
(74) *Attorney, Agent, or Firm* — Canon USA, Inc. IP Division

(57) ABSTRACT

An embodiment is an imaging apparatus including a plurality of unit cells. The imaging apparatus includes a first conductive member electrically connected to gates of the plurality of first transfer transistors, a second conductive member electrically connected to gates of the plurality of second transfer transistors, a third conductive member disposed adjacently to the first conductive member in a same wiring layer as the first conductive member and electrically connected to a plurality of nodes each included in respective one of the plurality of unit cells, and a fourth conductive member disposed adjacently to the second conductive member in a same wiring layer as the second conductive member. An opposing length of the first conductive member and the third conductive member is longer than an opposing length of the second conductive member and the fourth conductive member.

17 Claims, 9 Drawing Sheets

IMAGING APPARATUS, AND IMAGING SYSTEM

BACKGROUND OF THE INVENTION

1. Field of the Invention

One disclosed aspect of the embodiments relates to imaging apparatuses and imaging systems.

2. Description of the Related Art

An imaging apparatus has been proposed in which a plurality of photoelectric conversion units share an amplification transistor. Japanese Patent Laid-Open No. 2010-206172 discloses an imaging apparatus in which a first photoelectric conversion unit and a second photoelectric conversion unit are connected to one amplification transistor SF through a first transfer transistor and a second transfer transistor, which are respectively corresponding. In other words, two photoelectric conversion units share one amplification transistor.

Referring to the layout illustrated in FIG. 4 in Japanese Patent Laid-Open No. 2010-206172, a first control line Tx1 is provided between a first photoelectric conversion unit PD1 and a second photoelectric conversion unit PD2 and connected to a gate of the first transfer transistor. A second control line Tx2 is provided below, in the drawing, the second photoelectric conversion unit PD2 and connected to a gate of the second transfer transistor. A third control line RES is provided above, also in the drawing, the first photoelectric conversion unit PD1 and connected to a gate of a reset transistor. When the layouts are arranged in matrix, the second control line Tx2 and the third control line RES are disposed closely to each other while no other wirings are disposed in vicinity of the first control line Tx1.

SUMMARY OF THE INVENTION

An imaging apparatus according to one aspect of the embodiments includes a plurality of unit cells. Each of the plurality of unit cells includes a first photoelectric conversion unit, a second photoelectric conversion unit, a first transfer transistor configured to transfer an electric charge in the first photoelectric conversion unit, a second transfer transistor configured to transfer an electric charge in the second photoelectric conversion unit, and at least one transistor shared by the first and second photoelectric conversion units. A first conductive member is electrically connected to gates of the plurality of first transfer transistors. A second conductive member is electrically connected to gates of the plurality of second transfer transistors. A third conductive member is disposed adjacently to the first conductive member in a same wiring layer as the first conductive member and is electrically connected to a plurality of nodes each included in respective one of the plurality of unit cells. A fourth conductive member is disposed adjacently to the second conductive member in a same wiring layer as the second conductive member. An opposing length of the first conductive member and the third conductive member in a wiring layer having the first and third conductive members is longer than an opposing length of the second conductive member and the fourth conductive member in a wiring layer having the second and fourth conductive members. A width W1 of the first conductive member, a distance D1 between the first conductive member and the third conductive member in the wiring layer having the first and third conductive members, a width W2 of the second conductive member and a distance D2 between the second conductive member and the fourth conductive member in the wiring layer having the second and fourth conductive members satisfy a relationship of $W1 \times D1 > W2 \times D2$.

An imaging apparatus according to another aspect of the embodiments includes a plurality of unit cells. Each of the plurality of unit cells includes a first photoelectric conversion unit, a second photoelectric conversion unit, an amplification transistor, a first transfer transistor configured to transfer an electric charge in the first photoelectric conversion unit to an input node of the amplification transistor, and a second transfer transistor configured to transfer an electric charge in the second photoelectric conversion unit to the input node of the amplification transistor. A first conductive member is electrically connected to gates of the plurality of first transfer transistors. A second conductive member is electrically connected to gates of the plurality of second transfer transistors. A third conductive member is disposed adjacent to the first conductive member in a same wiring layer as the first conductive member and is electrically connected to a plurality of nodes each included in respective one of the plurality of unit cells. A fourth conductive member is disposed adjacently to the second conductive member in a same wiring layer as the second conductive member. An opposing length of the first conductive member and the third conductive member in a wiring layer having the first and third conductive members is longer than an opposing length of the second conductive member and the fourth conductive member in a wiring layer having the second and fourth conductive members. A width W1 of the first conductive member, a distance D1 between the first conductive member and the third conductive member in the wiring layer having the first and third conductive members, a width W2 of the second conductive member and a distance D2 between the second conductive member and the fourth conductive member in the wiring layer having the second and fourth conductive members satisfy a relationship of $W1 \times D1 > W2 \times D2$.

An imaging apparatus according to another aspect of the embodiments includes a plurality of unit cells. Each of the plurality of unit cells includes a first photoelectric conversion unit, a second photoelectric conversion unit, a first transfer transistor configured to transfer an electric charge in the first photoelectric conversion unit, a second transfer transistor configured to transfer an electric charge in the second photoelectric conversion unit, and at least one transistor shared by the first and second photoelectric conversion units. A first conductive member is electrically connected to gates of the plurality of first transfer transistors. A second conductive member is electrically connected to gates of the plurality of second transfer transistors. A third conductive member is disposed adjacently to the first conductive member in a same wiring layer as the first conductive member and is electrically connected to a plurality of nodes each included in respective one of the plurality of unit cells. A fourth conductive member is disposed adjacent to the second conductive member in a same wiring layer as the second conductive member. An opposing length of the first conductive member and the third conductive member in a wiring layer having the first and third conductive members is longer than an opposing length of the second conductive member and the fourth conductive member in a wiring layer having the second and fourth conductive members. A distance from the third conductive member to an end of the first conductive member on a side thereof opposite to the third conductive member is longer than a distance from the fourth conductive member to an end of the second conductive member on a side thereof opposite to the fourth conductive member.

Further features of the disclosure will become apparent from the following description of exemplary embodiments with reference to the attached drawings.

DESCRIPTION OF THE EMBODIMENTS

Figure 1:
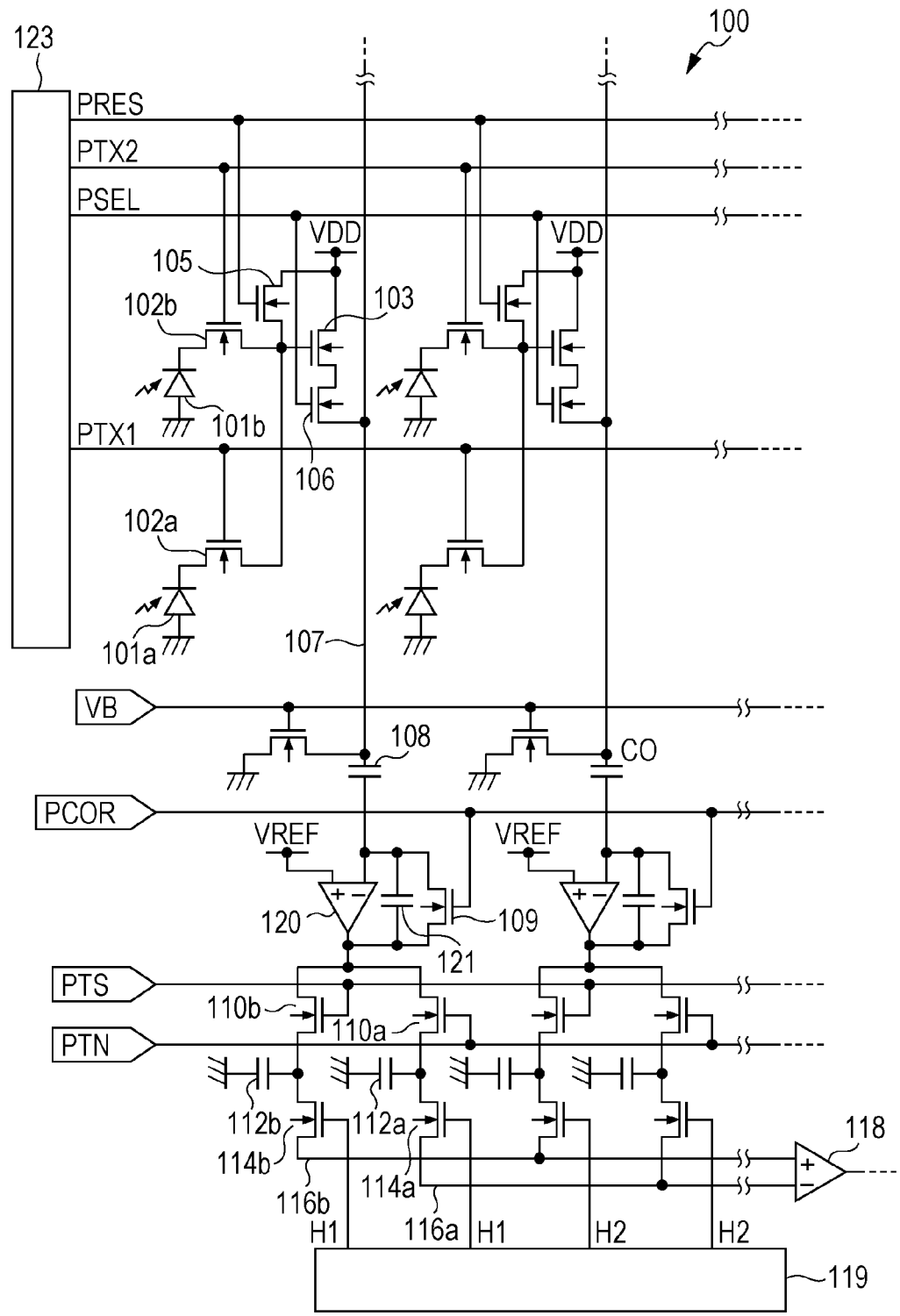
FIG. 1 illustrates an equivalent circuit of an imaging apparatus.

Improved image quality may be produced by some embodiments. One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

An imaging apparatus in which a plurality of photoelectric conversion units share a transistor included in a pixel circuit may sometimes have an asymmetrical layout between a wiring adjacent to a control line for a first transfer transistor and a wiring adjacent to a control line for a second transfer transistor. The present inventors have found that such an asymmetrical layout may cause a difference between noise occurring in pixels in an even row and noise occurring in pixels in an odd row.

In an imaging apparatus known to the inventor, because a plurality of photoelectric conversion units share an amplification transistor, the asymmetry as described above may occur in the wiring layout. More specifically, a length of facing parts (hereinafter referred to an opposing length) of a conductive member that configures a first control line Tx1 and a conductive member adjacent thereto in a same wiring layer is different from an opposing length of a conductive member that configures a second control line Tx2 and a conductive member adjacent thereto in a same wiring layer. Thus, in such an imaging apparatus, some wiring layout may cause a difference in noise between an even row and an odd row.

Such a difference in noise between rows may appear as stripe-shaped noise on an image. Because the stripe-shaped noise may be obtrusive, the noise difference between rows may easily deteriorate image quality.

Some embodiments provide a wiring layout which can reduce a noise difference between rows, thus improving image quality by imaging apparatuses of the embodiments.

According to one or some embodiments, an imaging apparatus is configured such that a plurality of photoelectric conversion units share at least one transistor. A first transfer transistor is provided for a first photoelectric conversion unit for transferring electric charges from the first photoelectric conversion unit. A second transfer transistor is provided for a second photoelectric conversion unit for transferring electric charges from the second photoelectric conversion unit. The first photoelectric conversion unit and second photoelectric conversion unit share at least a part of a circuit which reads signals from pixels. The circuit which reads signals from pixels may include an amplification transistor, a reset transistor, and a selection transistor, for example. In other words, the first photoelectric conversion unit and the second photoelectric conversion unit share a part or all of the amplification transistor, the reset transistor, and the selection transistor. The circuit which reads signals from pixels may include another transistor.

A control line for the first transfer transistor includes a first conductive member. A control line for the second transfer transistor includes a second conductive member. An opposing length L1 of the first conductive member and a third conductive member adjacent to the first conductive member is longer than an opposing length L2 of the second conductive member and a fourth conductive member adjacent to the second conductive member. In other words, the wiring layout adjacent to the control line for the first transfer transistor and the wiring layout adjacent to the control line for the second transfer transistor are asymmetrical.

It should be noted that an opposing length of the first conductive member and the third conductive member is defined as a length, along the direction to which the first conductive member extends, of the third conductive member in a layout pattern of the wiring layer having both of the first and third conductive members. An opposing length of the second conductive member and the fourth conductive member is defined as a length, along the direction to which the second conductive member extends, of the fourth conductive member in a layout pattern of the wiring layer having both of the second and fourth conductive members.

According to some embodiments, the layout as described above may also reduce a noise difference between even rows by properly setting the width of the first conductive member that configures a control line for a transfer transistor and the distance between a conductive member that configures the control line and a conductive member adjacent thereto. More specifically, a width W1 of the first conductive member that configures a control line for the first transfer transistor and has a longer opposing length, distance D1 between the first conductive member and a third conductive member adjacent thereto, a width W2 of the second conductive member that configures a control line for the second transfer transistor and has a shorter opposing length, and a distance D2 between the second conductive member and a fourth conductive member adjacent thereto are set to satisfy a relationship of W1×D1>W2×D2.

According to some embodiments, the distances D1 and D2 may vary in accordance with a part of the first or second conductive member. The distance from a particular part of the first or second conductive member to an adjacent conductive member is defined as the shortest distance from the particular part to the adjacent conductive member. The widths W1 and W2 may vary in accordance with a part of the first or second conductive member. Even when the distances and widths are not constant, a width W1 of at least a part of the first conductive member, a distance D1 between the part of the first conductive member and the third conductive member, a width W2 of at least a part of the second conductive member, and a distance D2 between the part of the second conductive member and the fourth conductive member are set to satisfy a relationship of W1×D1>W2×D2. Such a layout may reduce a noise difference.

With the configuration described above, the noise difference between an even row and an odd row may be reduced. Various mechanisms may be considered for causing noise between rows due to some wiring layouts. However, the satisfaction of a relationship of W1×D1>W2×D2 may reduce the noise difference between rows dues to layout asymmetry.

A difference in amount of shading between an even row and an odd row is an example of a noise difference. When an image sensing region is entirely uniformly irradiated by light, the difference between the signal value of a pixel at an nth column and the signal value of a pixel at the mth column of an even row may be different from the difference between the signal value of a pixel at an nth column and the signal value of a pixel at the mth column of an odd row.

Such a difference in amount of shading may occur when the time constant of the control line Tx1 for the first transfer transistor and the time constant of the control line Tx2 for the second transfer transistor are different from each other. For example, in the layout in FIG. 4 of Japanese Patent Laid-Open No. 2010-206172, because a parasitic capacitance of the first control line Tx1 is different from a parasitic capacitance of the second control line Tx2, their time constants may also differ.

The difference in time constant between control lines for transfer transistors may change the amounts of return electrons generated when the transfer transistors are turned off. An amount of return electrons depends on the speed of a change of voltage at a gate of a transfer transistor. As the time constant of a control line for a transfer transistor increases, the time required for changing the voltage increases, which then reduces the amount of return electrons. In other words, a difference in time constant of control lines for transfer transistors may cause a difference in amount of return electrons.

This is particularly significant when control circuits with an equal driving force drive a plurality of control lines. It is difficult to reduce such a difference in time constant by changing the driving forces of the control circuits.

Because the amount of return electrons may vary in accordance with the distance from a control circuit to a pixel, the return electrons may possibly cause shading shape noise. Shading having different forms between an even row and an odd row may appear on an image as noise that is difficult to correct by image processing.

According to some embodiments, the wiring layout as described above may reduce a noise difference between rows.

According to one or some embodiments, a distance from an end of a control line having a longer opposing length that is farther from an adjacent wiring to the adjacent wiring is larger than a distance from an end of the other control line that is farther from an adjacent island-shaped wiring to the island-shaped wiring. Such a wiring layout may reduce a noise difference between rows.

According to some embodiments, control lines for transistors included in pixels and a wiring commonly connected to a plurality of pixels such as a power supply line and a ground line are divided into a first wiring group and a second wiring group. One of the two wiring groups is disposed on an area between the first photoelectric conversion unit and the second photoelectric conversion unit, and the other of the two wiring groups is disposed on an area between the first photoelectric conversion unit or second photoelectric conversion unit and another photoelectric conversion unit. The control lines for the first and second transfer transistors are disposed in different wiring groups from each other. This wiring layout may easily be asymmetrical between a control line for a transfer transistor and a wiring adjacent thereto. This may provide a more significant effect of reducing a noise difference.

An embodiment will be described below with reference to drawings. The disclosure is not limited to embodiments below. Variation examples having a configuration that is acquired by partially changing an embodiment which will be described below without departing from the scope and spirit of the disclosure are also embodiments of the disclosure. An example acquired by adding a partial configuration of one of the embodiments below to another embodiment or an example acquired by replacing a partial configuration of one of the embodiments below by a partial configuration of another embodiment is also an embodiment.

First Embodiment

FIG. 1 illustrates an equivalent circuit of an imaging apparatus according to a first embodiment. An imaging apparatus 100 has a plurality of pixels arranged on an image sensing region. The plurality of pixels may configure a pixel array. Each of the pixels includes at least a photoelectric conversion unit. In the imaging apparatus 100 according to this embodiment, a plurality of pixels included in one unit cell share an amplifying unit. FIG. 1 illustrates four pixels, but more pixels may be provided therein.

The unit cell includes first and second photoelectric conversion units 101a and 101b, first and second transfer transistors 102a and 102b corresponding to the first and second photoelectric conversion units 101a and 101b, and an amplification transistor 103. The photoelectric conversion units 101a and 101b may be buried type photodiodes, for example. The first and second transfer transistors 102a and 102b transfer electric charges generated in the respective first and second photoelectric conversion units 101a and 101b to an input node of the amplification transistor 103. The amplification transistor 103 outputs signals based on the electric charges generated in the photoelectric conversion units 101a and 101b. The unit cell further includes a reset transistor 105 which resets voltage of the input node of the amplification transistor 103 to a predetermined voltage and a selection transistor 106 which controls electrical connection between a source of the amplification transistor 103 and an output line 107. The amplification transistor 103, reset transistor 105, and selection transistor 106 are shared by the first and second photoelectric conversion units 101a and 101b. Control nodes of the transistors are electrically connected to a vertical scanning unit 123. The vertical scanning unit 123 controls the transistors. According to this embodiment, the transistors may be MOS transistors. Control nodes of the transistors are gates.

Each of the output lines 107 has column circuits. The column circuits include a column amplifier 120, a feedback capacitance 121, a clamp capacitance 108, and a feedback switch 109. Through these circuits, signals forwarded to the output line 107 are amplified and transferred to a circuit of a following stage. The column circuits further include signal holding capacitors 112a and 112b and switches 110a and 110b. Through these circuits, a signal output from the column amplifier 120 is held. The signal holding capacitors 112a and 112b are connected to horizontal output lines 116a and 116b through switches 114a and 114b, respectively. The horizontal output lines 116a and 116b are connected to an output unit 118. Because the column amplifier 120 is followed by two signal paths, subtraction processing performed in the output unit 118 may remove offset noise of each column. The switches 114a and 114b have gates electrically connected to a horizontal scanning unit 119. The horizontal scanning unit 119 controls the ON- and OFF-states of the switches 114a and 114b.

Figure 2:
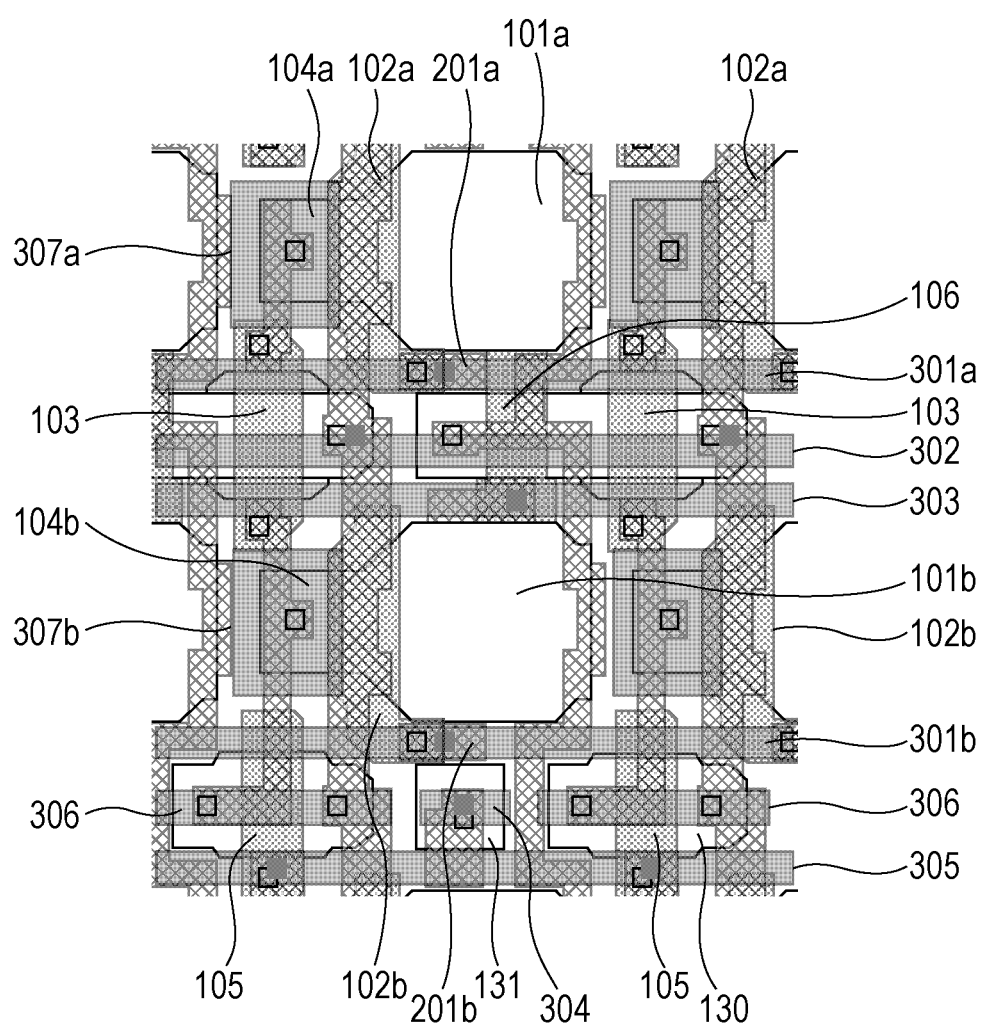
FIG. 2 is a schematic diagram of a planar layout of the imaging apparatus.

Next, a layout of the imaging apparatus 100 of this embodiment will be described. FIG. 2 is a schematic diagram illustrating a planar layout according to this embodiment. Like numbers refer to parts corresponding to those illustrated in FIG. 1. It should be noted that like numbers referring to the transistors in FIG. 1 also refer to gate electrodes of transistors corresponding to those illustrated in FIG. 2.

The imaging apparatus 100 may be configured by one chip with a semiconductor substrate. On an image sensing region of the semiconductor substrate, the photoelectric conversion units 101a and 101b and transistors are provided. The gate electrodes of the transistor may be formed of polysilicon, for example. The image sensing region has floating diffusion regions 104a and 104b to which electric charges are transferred. The floating diffusion regions 104a and 104b are electrically connected to the gate electrode of the amplification transistor 103 to configure an input node of the amplification transistor 103.

The imaging apparatus 100 has a plurality of wiring layers on the semiconductor substrate. FIG. 2 illustrates a first wiring layer and a second wiring layer. The first wiring layer contains a conductive member which electrically connects the floating diffusion regions 104a and 104b and the gate electrode of the amplification transistor 103 and a conductive member that configures the output line 107 and a conductive member that configures power supply line. The first wiring layer contains conductive members 201a and 201b which relay the second wiring layer and a semiconductor region or a gate electrode.

The second wiring layer contains a conductive member that configures control lines for gates of transistors. Conductive members 301a and 301b are electrically connected to gate electrodes of the transfer transistors 102a and 102b. Control pulses for operating the transfer transistors 102a and 102b are received to gates of the transfer transistors 102a and 102b through the conductive members 301a and 301b. The conductive member 303 is electrically connected to a gate electrode of the selection transistor 106. The conductive member 305 is electrically connected to a gate electrode of the reset transistor 105. A conductive member that configures a control line for a gate of a transistor herein is electrically connected to gates of transistors in a plurality of pixels.

The second wiring layer contains a conductive member 302 that configures a power supply line, a conductive member 304 that configures a ground line, and light-shielding conductive members 306, 307a, and 307b. The conductive member 302 which configures a power supply line is electrically connected to a semiconductor region for supply of power supply voltage to a plurality of pixels. It should be noted that a third wiring layer may also be provided which contains a conductive member that configures a ground line and is electrically connected to the conductive member 304. Light-shielding conductive members 306, 307a, and 307b may electrically float or may receive supply of a predetermined voltage.

A first group of the conductive members contained in the second wiring layer is disposed between the first photoelectric conversion unit 101a and the second photoelectric conversion unit 101b. According to this embodiment, the first group includes the conductive members 301a, 302, and 303. A second group of the conductive members contained in the second wiring layer is disposed between the second photoelectric conversion unit 101b and a photoelectric conversion unit, not illustrated. According to this embodiment, the second group includes the conductive members 301b, 304, 305, and 306. The first group may be disposed between first photoelectric conversion unit 101a and a photoelectric conversion unit, not illustrated, while the second group may be disposed between the first photoelectric conversion unit 101a and the second photoelectric conversion unit 101b.

Figure 3:
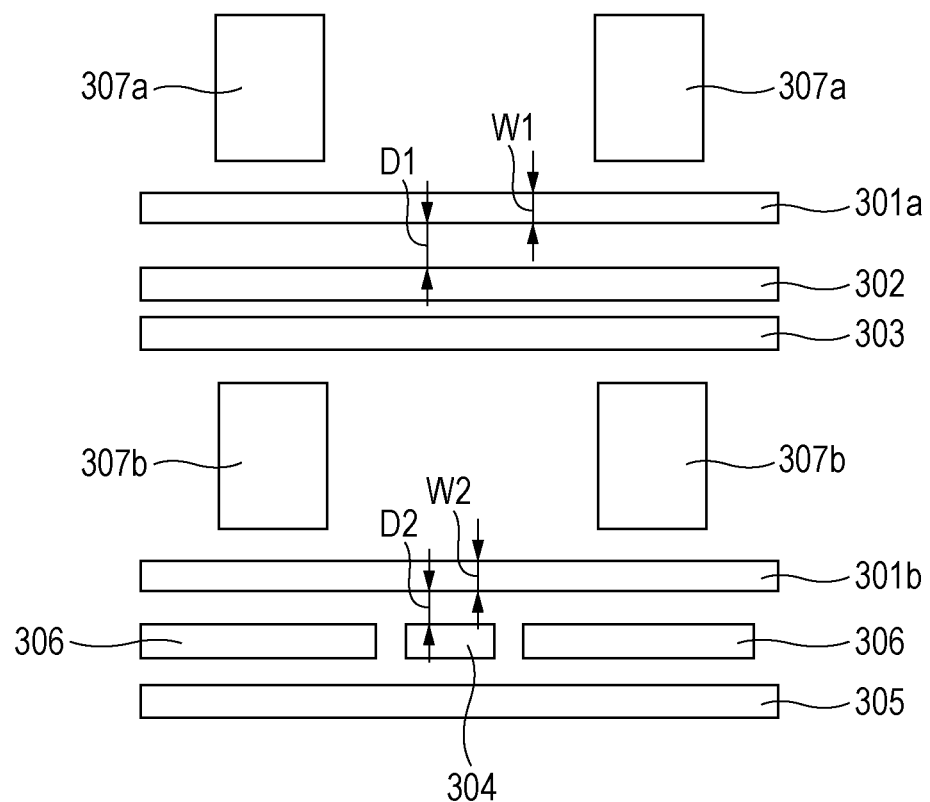
FIG. 3 is a schematic diagram of a planar layout of the imaging apparatus.

FIG. 3 is a schematic diagram of a planar layout diagram only illustrating the conductive members contained in the second wiring layer. The conductive member 301a that configures a control line for the first transfer transistor 102a is adjacent to the conductive member 302 that configures a power supply line. The conductive member 302 extends across a plurality of pixels or over the entire image sensing region in the second wiring layer so as to electrically connect to power supply nodes of a plurality of pixels. Thus, the opposing length of the conductive member 301a and conductive member 302 is long. The opposing length of the conductive member 301a and conductive member 302 is a length of the conductive member 302 along a direction to which the conductive member 301a extends.

The conductive member 301b that configures a control line for the second transfer transistor 102b is adjacent to the conductive members 304 and 306. The conductive member 304 will be described, but the same is true for the conductive member 306. From a viewpoint of the layout pattern of the second wiring layer, the length of the conductive member 304 along the direction to which the conductive member 301b extends is shorter than the pixel pitch. The conductive member 304 may be island-shaped in the second wiring layer. An island-shaped conductive member may refer to a conductive member that configures a wiring for electric connection within a pixel or electric connection within a unit cell, for example, or a conductive member which relays a conductive member in an upper wiring layer and a semiconductor region, a gate electrode or a conductive member in a lower wiring layer. Such a conductive member may be island-shaped in the second wiring layer without extending across the entire image sensing region. Thus, the opposing length of the conductive member 301b and the island-shaped conductive member 304 is short. The opposing length of the conductive member 301b and the conductive member 304 refers to a length of the conductive member 304 along the direction to which the conductive member 301b extends. According to this embodiment, a plurality of conductive members 304 and 306 are disposed adjacent to the conductive member 301b within an area having one pixel or a unit cell. In this case, the opposing length of the conductive member 301b may be equal to a total of lengths of the plurality of conductive members along the direction to which the conductive member 301b extends.

Therefore, according to this embodiment, the opposing length of the conductive member 301a and conductive member 302 is longer than the opposing length of the conductive member 301b and conductive member 304. If conductive members are disposed at equal intervals, the parasitic capacitance increases as an opposing length increases. In a layout according to this embodiment, the width W1 of the conductive member 301a, the distance D1 between the conductive member 301a and the conductive member 302, the width W2 of the conductive member 302b, and the distance D2 of the conductive member 302b and conductive member 304 satisfy the following relationship (1):

$$W1 \times D1 > W2 \times D2 \tag{1}$$

For example, when the width W1 of the conductive member 301a is equal to the width W2 of the conductive member 302b, the distance D1 between the conductive member 301a and the conductive member 302 is longer than the distance D2 between the conductive member 302b and the conductive member 304. In another example, when the distance D1 is equal to the distance D2, the width W1 is larger than the width W2.

From a different aspect, according to this embodiment, the distance from an end of the conductive member 301a on the opposite side of the adjacent conductive member 302 to the adjacent conductive member 302 is longer than the distance from an end of the conductive member 301b on the opposite side of the adjacent conductive member 304 to the adjacent conductive member 304. That is, a relationship W1+D1>W2+D2 is satisfied.

This layout may inhibit image shading which occurs between an even row and an odd row. One reason for this may be because the difference between the time constant of a control line for the first transfer transistor 102a and the time constant of a control line for the second transfer transistor 102b is smaller or equal.

Figure 4A:
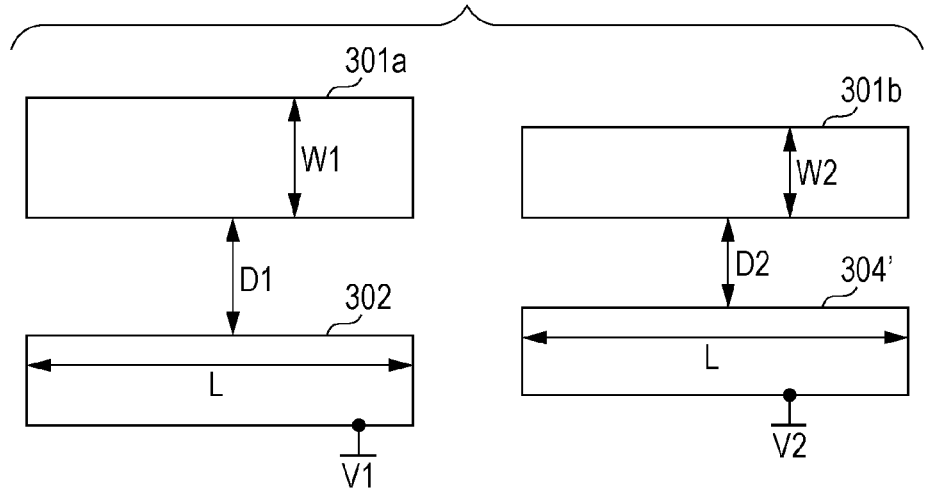
FIGS. 4A to 4C are schematic diagrams of planar layouts of the imaging apparatus.

This embodiment will further be described with reference to FIGS. 4A to 4C. FIG. 4A illustrates a planar layout in which two conductive members having an equal length L are disposed in parallel. In the left pair of FIG. 4A, the conductive member 302 receives a predetermined voltage V1. A time constant T1 for changing voltage in the conductive member 301a is given by the following expression (2) using a resistance R1 and parasitic capacitance C1 of the conductive member 301a:

$$T1 = R1 \times C1 \quad (2)$$

where R1 is a resistance and C1 is a parasitic capacitance of the conductive member 301a.

The resistance R1 of the conductive member 301a is given by the following expression (3):

$$R1 = (\rho \times L)/(W1 \times H) \quad (3)$$

where L is a length, H is a height, W1 is a width and $\rho$ is a specific resistance of the conductive member 301a.

The parasitic capacitance C1 of the conductive member 301a is given by the following expression (4)

$$C1 = (\in \times L \times H)/D1 \quad (4)$$

where L is a length and H is a height of the conductive member 301a, D1 is a distance between the conductive member 301a and the conductive member 302, and $\in$ is a dielectric constant of a member between them.

Using Expressions (2) to (4), the time constant T1 may be expressed by the following expression (5):

$$T1 = (\in \times \rho \times L2)/(W1 \times D1) \quad (5)$$

In the right pair of FIG. 4A, a conductive member 304' receives a predetermined voltage V2. A time constant T2 for changing voltage in the conductive member 301b is given by the following expression (6):

$$T2 = (\in \times \rho \times L2)/(W2 \times D2) \quad (6)$$

where W2 is a width of the conductive member 301b, and D2 is a distance between the conductive member 301b and the conductive member 304'.

Comparing between expressions (5) and (6), one of conductive members having a larger product of the width W and the distance D may have a lower time constant if the conductive members have an equal length. In other words, one having a larger product of the width W and the distance D may have voltage that changes faster. In FIG. 4A, a relationship W1×D1>W2×D2 is satisfied. Therefore, the time constant T1 of the conductive member 301a is lower than the time constant T2 of the conductive member 301b.

Figure 4B:
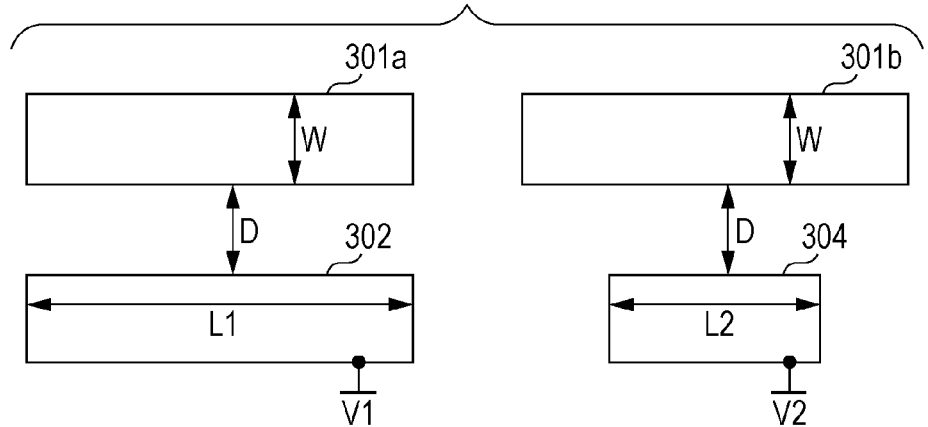

Next, FIG. 4B illustrates a planar layout in which conductive members 302 and 304 having different lengths L1 and L2 are disposed adjacently to the two conductive members 301a and 301b, respectively. The conductive members 301a and 301b have an equal length L and an equal width W. The distance D between the conductive member 301a and the conductive member 302 and the distance D between the conductive member 301b and the conductive member 304 are equal. In this case, the time constant T1 of the conductive member 301a and the time constant T2 of the conductive member 302b are given by the following expression (7) and (8):

$$T1 = (\in \times \rho \times L \times L1)/(W \times D) \quad (7)$$

$$T2 = (\in \times \rho \times L \times L2)/(W \times D) \quad (8)$$

where L1>L2.

Therefore, comparing the expressions (7) and (8), the time constant T1 of the conductive member 301a is larger than the time constant T2 of the conductive member 301b in the layout in FIG. 4B. In other words, as the length of adjacent wirings, that is, the opposing length increases, the time constant increases with the equal widths and equal distances.

Figure 4C:
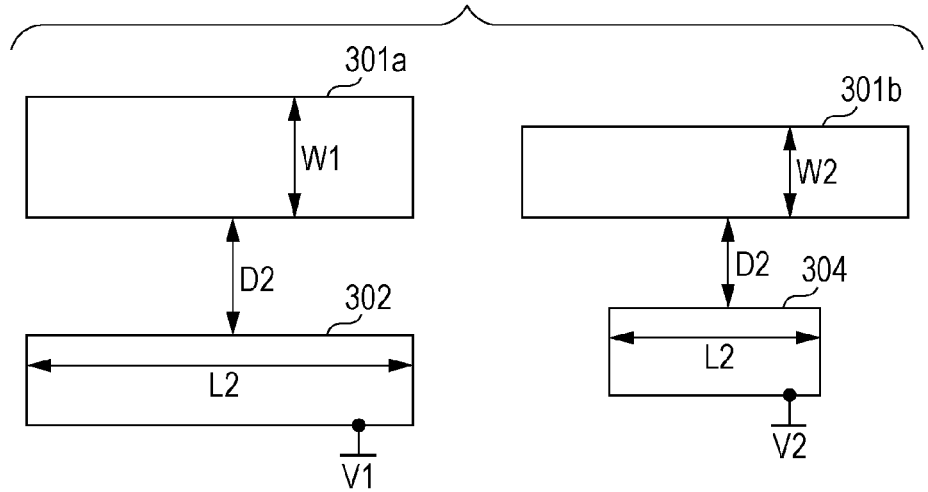

FIG. 4C is a schematic diagram illustrating a planar layout of conductive members according to this embodiment. In FIG. 4C, an opposing length of the conductive member 301a relative to an adjacent wiring is longer than the opposing length of the conductive member 301b relative to an adjacent wiring. Focusing on the opposing length only, the layout allows a larger time constant T1 of the conductive member 301a. On the other hand, the relationship between the widths and distances is W1×D1>W2×D2. In other words, for the opposing length of the conductive member 301a, the product of the width W1 and the distance D1 is larger than the product of the width W1 and the distance D2 of the conductive member 302b.

Such a layout may reduce a difference between the time constant T1 of the conductive member 301a and the time constant T2 of the conductive member 301b. Alternatively, the ratio between W1×D1 and W2×D2 may be determined to substantially cancel the difference in time constant due to a difference in opposing length for a substantially equal time constant therebetween. More specifically, the ratio between W1×D1 and W2×D2 may be determined on basis of the ratio between the opposing lengths. For example, the ratio between W1×D1 and W2×D2 may be L1:L2 that is the ratio between the opposing lengths.

The description above has assumed that the specific resistance $\rho$ and dielectric constant $\in$ are constant, and the conductive members have an equal height H. When a different material is used, the specific resistance $\rho$ and dielectric constant $\in$ may differ. Even when the same material is used, the specific resistance $\rho$ and dielectric constant $\in$ may vary in accordance with its position. The heights H of conductive members may differ from each other. The resistances of the conductive members may not satisfy expression (3) because of an influence of a contact resistance and forms of the conductive members. The parasitic capacitances of the conductive members may not satisfy expression (3) or (4) because of an influence of a parasitic capacitance relative to another conductive member not illustrated in FIGS. 4A to 4C. However, even under any of those conditions, satisfaction of the relationship W1×D1>W2×D2 may reduce an influence of different opposing lengths on the time constants.

According to consideration by the present inventor, if at least a part of the conductive member 301a and at least a part of the conductive member 301b satisfy the relationship of W1×D1>W2×D2, the effect of reducing time constant differences may be acquired.

A conductive member that is adjacent to the conductive members 301a and 301b may be a member that configures a wiring to which voltage is supplied. For example, adjacently to the conductive member 301a, the conductive member 305 that configures a control line for the reset transistor 105 or the conductive member 303 that configures a control line for the selection transistor 106 may be disposed. Because these conductive members are connected to gates of transistors in a plurality of pixels, the opposing length relative to the conductive member 301a is often long. On the other hand, an island-shaped wiring may be disposed adjacently to the conductive member 301b.

Next, a comparison example will be described for further explanation of advantages of this embodiment. In a comparison example, the conductive members 301a and 301b that configure control lines for transfer transistors have an equal width, and the distances between the conductive members 301a and 301b and conductive members 302 and 304 adjacent thereto in a same layer are equal. The conductive members 301a and 301b have an equal wiring resistance but have different parasitic capacitances due to differences in opposing lengths relative to the adjacent conductive members. A parasitic capacitance of the conductive member 301a having a longer opposing length relative to the adjacent conductive member is larger than a parasitic capacitance of the conductive member 301b. This causes a time constant difference between the conductive members 301a and 301b, and pulse waveforms of pixels at a same column have different degrees of dullness. Because the amount of return electrons depends on a pulse waveform for driving the transfer transistors 102a and 102b, a difference in transfer characteristics between the conductive members 301a and 301b (amount-of-return electrons difference) may appear as a difference in shading form of even- and odd rows at a dark output, which may possibly deteriorate image quality. In the imaging apparatus of this comparison example, because a time constant difference between even- and odd-rows is difficult to reduce, lower image quality may possibly be caused.

Next, operations of the imaging apparatus 100 of this embodiment will be described with reference to timing charts of drive pulses in FIGS. 5A and 5B. It is assumed that, before a read operation, electric charges are accumulated in the photoelectric conversion units 101a and 101b after a lapse of a predetermined exposure time.

Figure 5A:
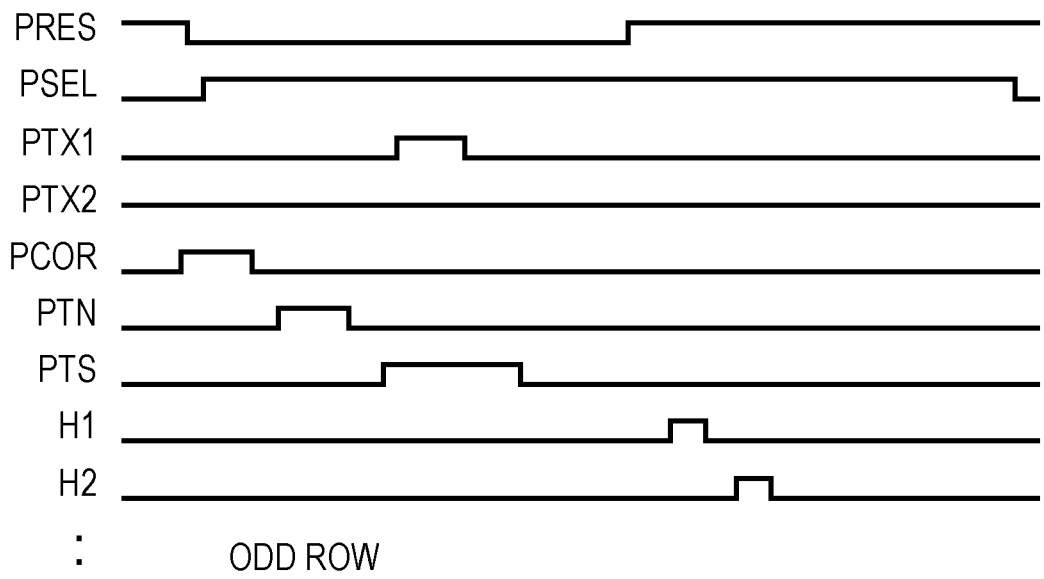
FIGS. 5A and 5B illustrate drive signals for the imaging apparatus.
Figure 5B:
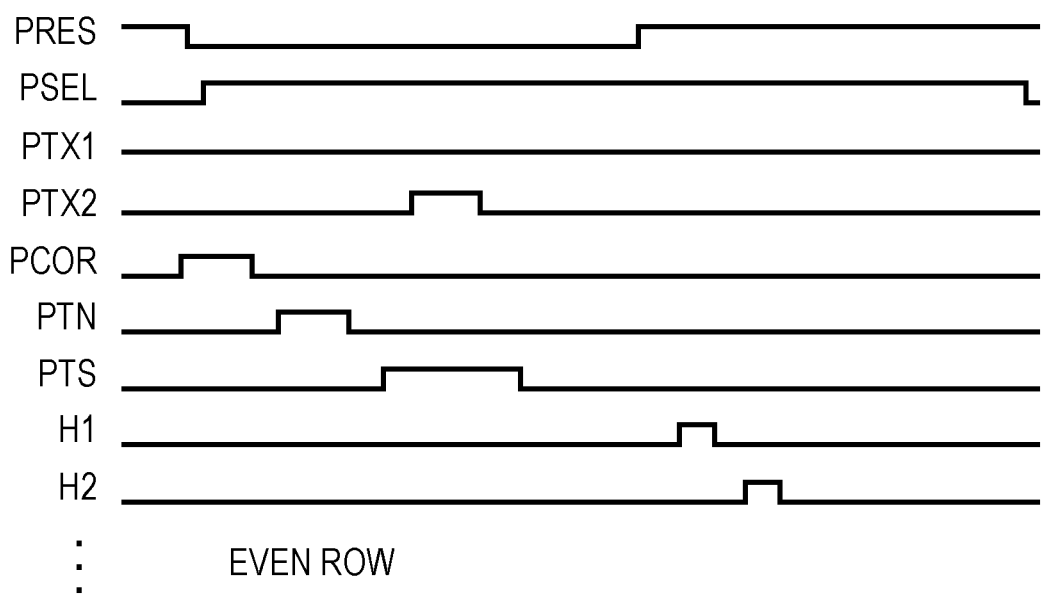

FIG. 5A is a timing chart illustrating a read operation on a predetermined odd row ((2n−1)th row) including the photoelectric conversion unit 101a. As illustrated in FIG. 1, the vertical scanning unit 123 supplies drive pulses. For a row to read signals, a reset pulse PRES is shifted from a high level to a low level, which cancels the reset of a gate of the amplification transistor 103. In this case, voltage corresponding to a dark state (reset state) is held in a capacitance Cfd of a floating diffusion region connected to the gate. When a row select pulse PSEL is shifted to a high level subsequently, dark-state output appears on the output line 107. In this case, the column amplifier 120 operates as a voltage follower, and the output of the column amplifier 120 is substantially equal to a reference voltage VREF. After a lapse of a predetermined period of time, a clamp pulse PC0R is shifted from a high level to a low level, which clamps the dark-state output on the output line 107. Then, a pulse PTN is shifted to a high level, which turns on the switch 110a. A dark-state signal containing an offset of the column amplifier 120 is held in the signal holding capacitor 112a.

After that, a transfer pulse PTX1 turns on the transfer transistor 102a for a predetermined period of time, and the electric charges stored in the photoelectric conversion unit 101a are transferred to the input node of the amplification transistor 103. On the other hand, the transfer transistor 102b is kept off, and the electric charges in the photoelectric conversion unit 101b are held in a standby state. In this case, the voltage at the input node of the amplification transistor 103 decreases by Q/Cfd where if the transferred electric carriers are electrons, and the absolute value of the amount of the transferred electric charges is Q. Correspondingly, a bright-state output appears on the output line 107. The bright-state output is held in the other signal holding capacitor 112b during a period when the pulse PTS is shifted to a high level and the switch 110b has an ON state.

After that, the switches 114b and 114a are selected sequentially with scan pulses H1, H2 . . . generated by the horizontal scanning unit 119. Thus, the signals held in the signal holding capacitors 112b and 112a are read to the horizontal output lines 116b and 116a and are then input to the output unit 118 for differential output. Up to this point, the read operation on one odd row of the photoelectric conversion unit 101a has completed.

Next, a substantially same read operation is repeated on the photoelectric conversion unit 101b at a predetermined even row (2 nth row). The read operation is different from the read operation performed on an odd row in that the transfer pulse PTX2 instead of the transfer pulse PTX1 is shifted to a high level as illustrated in FIG. 5B to turn on the transfer transistor 102b. Outputs have been read from pixels at two rows after photocarriers in the photoelectric conversion unit 101b provided in the even row are read. This operation is repeatedly performed on the entire screen in order of (2n+1)th row, (2n+2)th row . . . , for example, to output one screen.

As described above, according to this embodiment, a unit cell includes a first transfer transistor and a second transfer transistor. A first conductive member configures a control line for the first transfer transistor, and a second conductive member configures a control line for the second transfer transistor. In a same wiring layer as that of the first conductive member, a third conductive member is disposed adjacently to the first conductive member. In a same wiring layer as that of the second conductive member, a fourth conductive member is disposed adjacently to the second conductive member. An opposing length of the first and third conductive members in the wiring layer where they are disposed is longer than the opposing length of the second and fourth conductive member in the wiring layer where they are disposed. A product of a width W1 of the first conductive member having a longer opposing length and a distance D1 between the first conductive member and third conductive member that are adjacent to each other is larger than a product of a width W2 of the second conductive member having a shorter opposing length and a distance D2 between the second conductive member and third conductive member that are adjacent to each other. In other words, a relationship W1×D1>W2×D2 is satisfied. This configuration may reduce noise differences due to an asymmetrical layout between rows or may equalize such noise differences. As a result, improved image quality may be produced.

According to this embodiment, the conductive member 302 is disposed closely to the conductive member 303. Thus, the distance D1 between the conductive member 301a and the conductive member 302 is larger than the distance D2 between the conductive member 301b and the conductive member 304. This configuration may increase the aperture of the photoelectric conversion unit, which may produce an improved sensitivity.

Second Embodiment

Another embodiment will be described. An equivalent circuit of an imaging apparatus of this embodiment is similar to that of the first embodiment. More specifically, FIG. 1 illustrates an equivalent circuit diagram of this embodiment.

Figure 6:
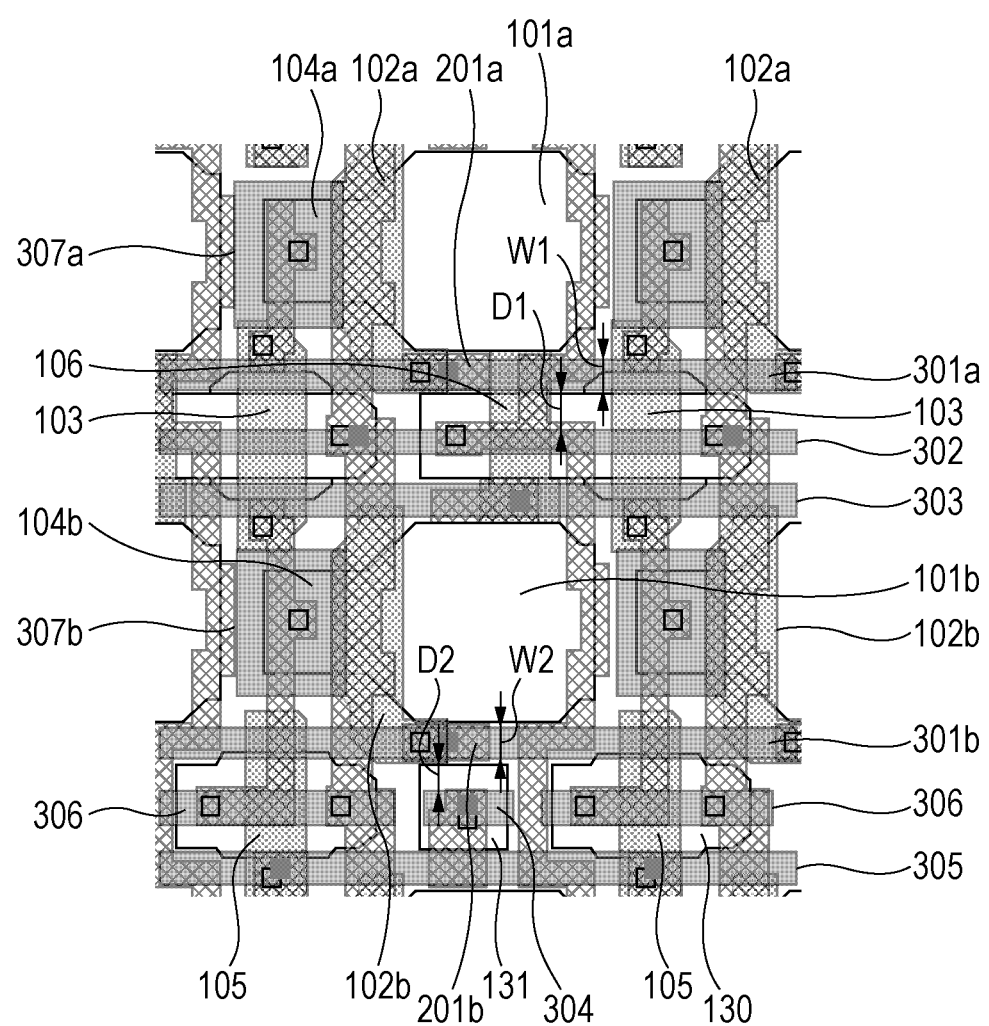
FIG. 6 is a schematic diagram of a planar layout of the imaging apparatus.

FIG. 6 is a schematic diagram illustrating a pixel planar layout of this embodiment. In FIG. 6, like numbers refer to like parts having the same functions as in the first embodiment, and detail description will be omitted. According to this embodiment, a width W1 of the conductive member 301a, a distance D1 between the conductive member 301a and the conductive member 302, a width W2 of the conductive member 302b, and a distance D2 between the conductive member 302b and the conductive member 304 are arranged to satisfy a relationship of W1×D1>W2×D2.

According to this embodiment, the width of the conductive member 302 adjacent to the conductive member 301a is smaller than the width of the conductive member 304 adjacent to the conductive member 301b. Reducing the width of the conductive member 302 increases the distance D1 between the conductive member 301a and the conductive member 302. Thus, the distance between the conductive member 302 and the conductive member 303 and the distance between the conductive member 304 and the conductive member 305 are substantially equal. In other words, the distance of the conductive member 302 and the conductive member 303 is not significantly narrower than other distances.

With a narrow distance between conductive members, a foreign substance contaminated during a manufacturing process may highly possibly cause short-circuiting between wirings. According to this embodiment, it is configured that parasitic capacitances of control lines for transfer transistors are adjusted without reducing the distance between wirings, which may reduce a risk of reduction of product yield.

According to this embodiment, with a narrow width of the conductive member 302, the distance D1 between the conductive member 301a and the conductive member 302 is larger than the distance D2 between the conductive member 301b and the conductive member 304. This configuration may increase the aperture of the photoelectric conversion unit, which may produce an improved sensitivity.

Third Embodiment

Another embodiment will be described. An equivalent circuit of an imaging apparatus of this embodiment is similar to that of the first embodiment. More specifically, FIG. 1 illustrates an equivalent circuit diagram of this embodiment.

Figure 7:
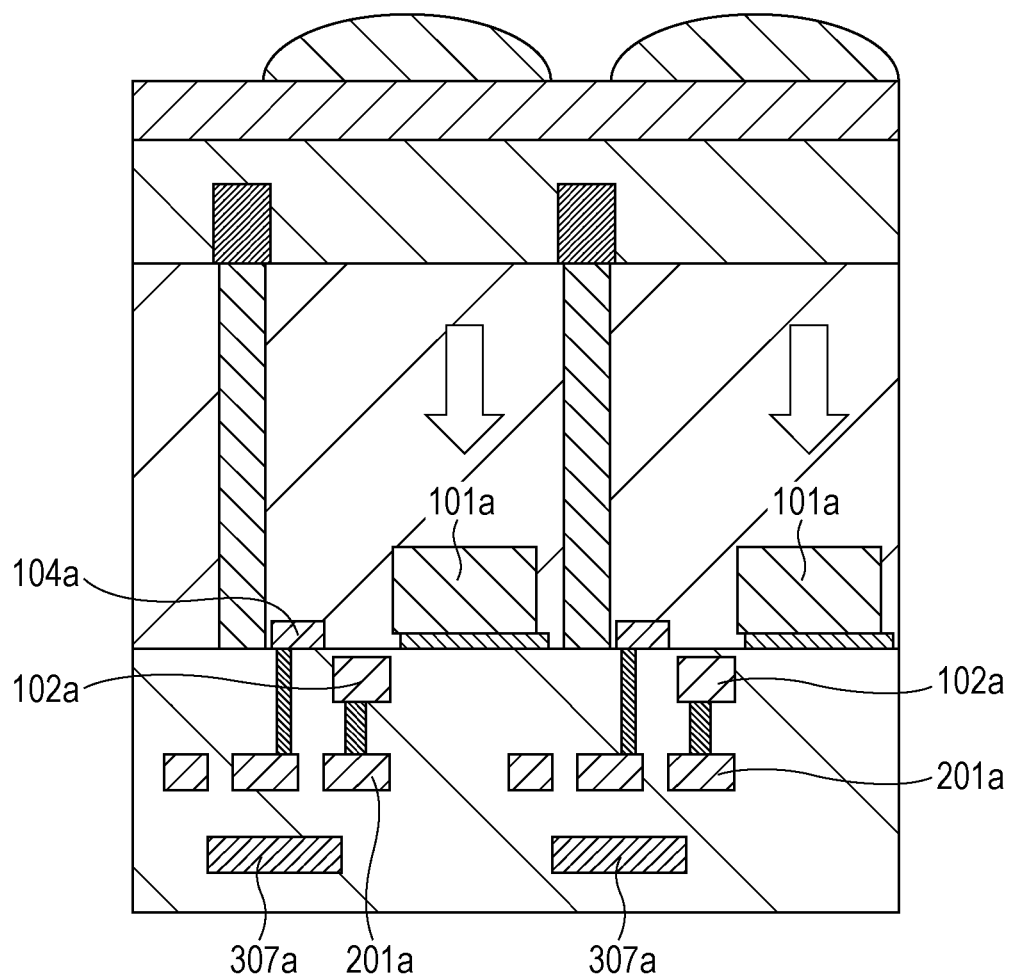
FIG. 7 is a schematic diagram of a section structure of the imaging apparatus.

FIG. 7 is a schematic diagram of a cross-sectional structure of this embodiment. In FIG. 7, like numbers refer to like parts having the same functions as in the first embodiment or second embodiment, and detail description will be omitted.

FIG. 7 schematically illustrates a cross-section taken on a wiring through the first photoelectric conversion unit 101a in FIG. 2 or FIG. 6 along a direction of transfer of electric charges. This embodiment is what-is-called a back side illumination imaging apparatus. On a first principal surface side (front side) of a semiconductor substrate, a gate electrode of a transfer transistor 102a and a conductive member 201a connected to the gate electrode are disposed. The conductive members illustrated in FIG. 2 or FIG. 6 though not illustrated in FIG. 7 are all disposed on the first principal surface side (front side) of a semiconductor substrate. Light enters from a second principal surface side (back side) of the semiconductor substrate.

Because the imaging apparatus according to this embodiment is back side illumination, conductive members may be arranged irrespective of a constraint that wiring apertures on photoelectric conversion units are kept equal for prevention of a sensitivity difference between the photoelectric conversion units 101a and 101b at even- and odd rows. More specifically, a layout that satisfies the relationship of W1×D1>W2×D2 may arbitrarily be designed. Thus, differences in noise may easily be reduced more than front side illumination.

In particular, in the back side illumination imaging apparatus, a part or all of the conductive members 301a and 301b and conductive members that are adjacent thereto may be laid out over the photoelectric conversion units. This configuration may further reduce differences in time constant.

Fourth Embodiment

Another embodiment will be described. This embodiment is a variation example of a conductive member pattern according to first to third embodiments. An equivalent circuit of an imaging apparatus of this embodiment is similar to that of the first embodiment. More specifically, FIG. 1 illustrates an equivalent circuit diagram of this embodiment. In the description and illustration of this embodiment, like numbers refer to like parts having the same functions as in the first to third embodiments, and detail description will be omitted.

Figure 8A:
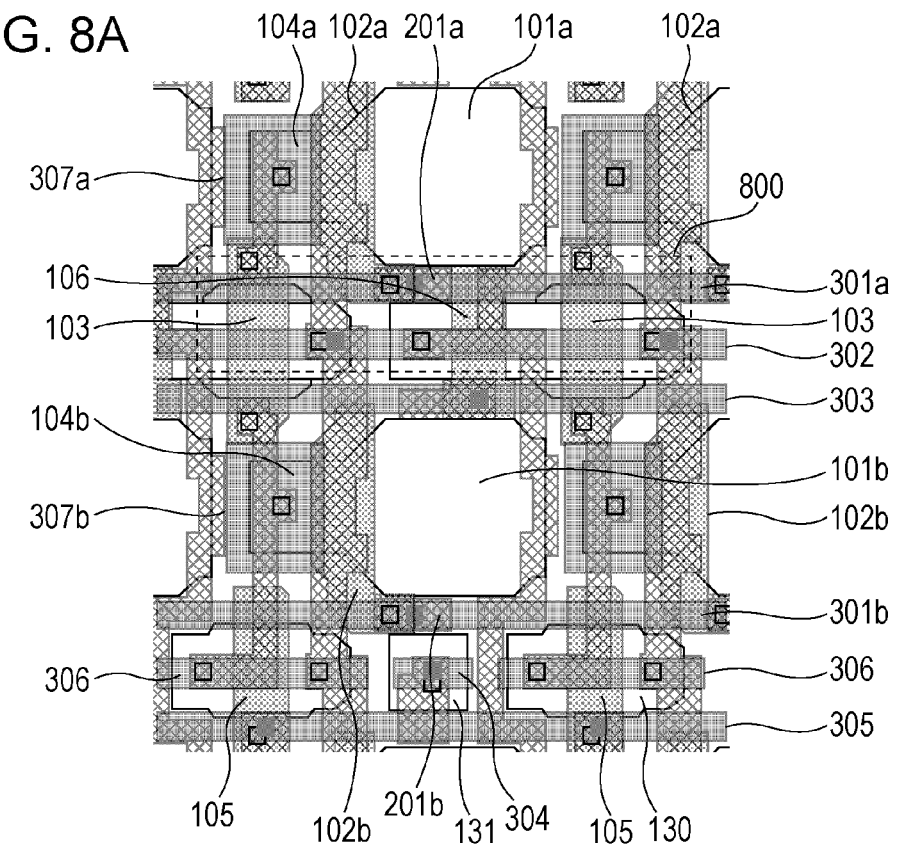
FIGS. 8A to 8E are schematic diagrams of planar layouts of the imaging apparatus.
Figure 8B:
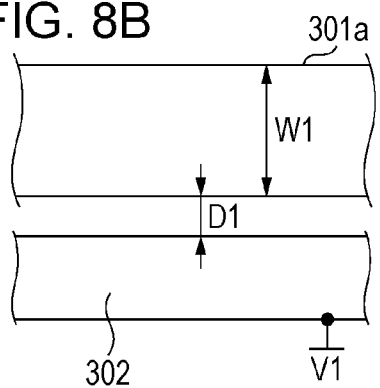

FIG. 8A is a schematic diagram illustrating a layout of this embodiment. FIG. 8A illustrates a conductive member 301a that configures a control line for the first transfer transistor 102a and a conductive member 302 that is disposed adjacently to the conductive member 301a in a same wiring layer. The conductive member 301a has at least a part having a width W1, and the distance between the part and the conductive member 302 is equal to D1.

A conductive member 301b that configures a control line for the second transfer transistor 102a has a width W2. The distance between the conductive member 301b and a conductive member 304 disposed adjacently to the conductive member 301b is equal to D2. The opposing length of the conductive member 301b and conductive member 304 is shorter than an opposing length of the conductive member 301a and the conductive member 302.

FIGS. 8B to 8E illustrate variations of a part surrounded by a broken line 800 in the conductive member 301a and conductive member 302 in FIG. 8A. In the layout illustrated in FIG. 8B, the width W1 of the conductive member 301a is larger than the widths of other conductive members. More specifically, a relationship D1<D2 is satisfied. In the layout illustrated in FIG. 8B, the relationship W1×D1>W2×D2 is satisfied. As a result, noise differences between rows may be reduced. The difference in time constant may be reduced between the conductive member 301a and the conductive member 301b. The width of an external part to the broken line 800 of the conductive member 301a may be equal to W1.

Figure 8C:
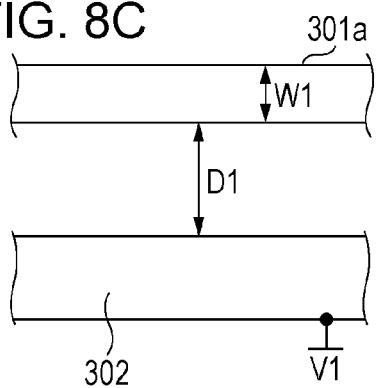

In the layout illustrated in FIG. 8C, the width W1 of the conductive member 301a is smaller than the widths of other conductive members. The relationship D1>D2 is satisfied on the other hand. Thus, the relationship W1×D1>W2×D2 is satisfied also in the layout illustrated in FIG. 8B. As a result, a noise difference between rows may be reduced. The difference in time constant may also be reduced between the conductive member 301a and the conductive member 301b. The width of the external part to the broken line 800 of the conductive member 301a may be equal to W1.

Figure 8D:
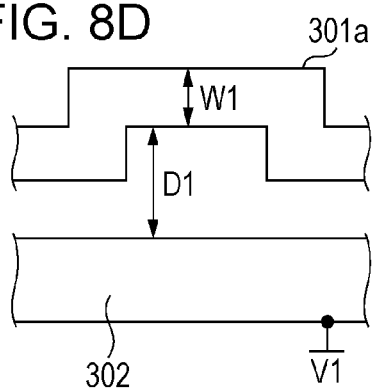

In the layout illustrated in FIG. 8D, a part of the conductive member 301a is disposed farther away from an adjacent conductive member than the other part of the conductive member 301*a*. The part of the conductive member 301*a* disposed away from an adjacent conductive member satisfies the relationship W1×D1>W2×D2. For example, the part disposed away from an adjacent conductive member may be a part disposed at a largest distance relative to an adjacent conductive member. Also in the layout in FIG. 8D, a noise difference between rows may be reduced. The difference in time constant may be reduced between the conductive member 301*a* and the conductive member 301*b*.

Figure 8E:
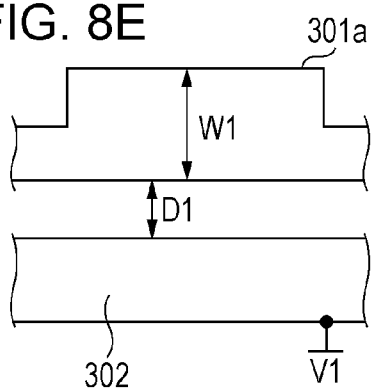

In the layout illustrated in FIG. 8E, the width of a part of the conductive member 301*a* is larger than width of the other part. The part having a larger width of the conductive member 301*a* satisfies the relationship W1×D1>W2×D2. Also in this layout, a noise difference between rows may be reduced. The difference in time constant between the conductive member 301*a* and the conductive member 301*b* may be reduced.

According to this embodiment, adoption of various layouts may allow reduction of a noise difference between rows irrespective of a layout constraint due to arrangement of other conductive members. As a result, an improved image quality may be produced.

Fifth Embodiment

Figure 9:
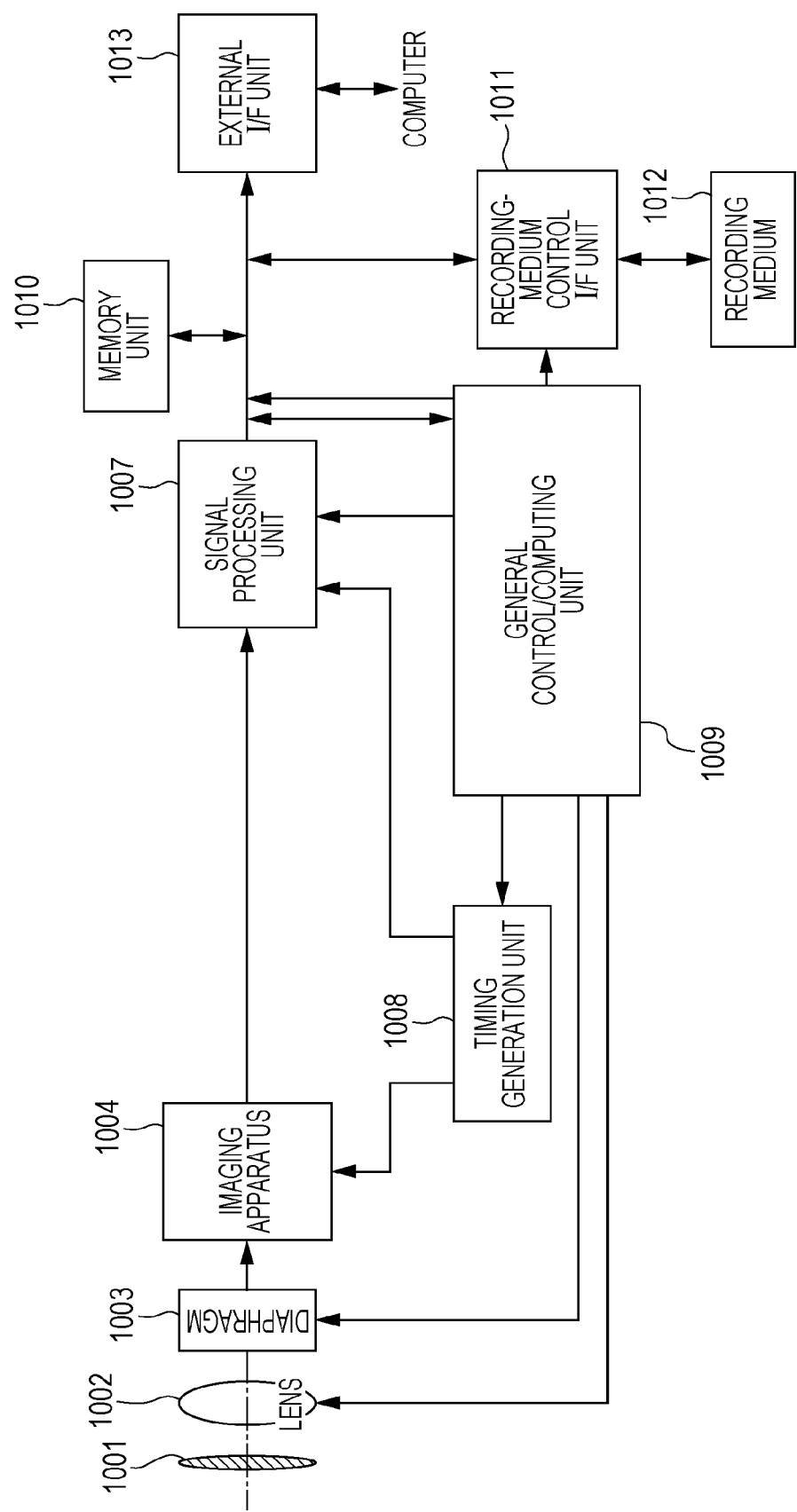
FIG. 9 is a block diagram of an imaging system.

An embodiment of an imaging system will be described. The imaging system may be a digital still camera, a digital camcorder, a copier, a facsimile, a mobile phone, a vehicle-mounted camera, an observation satellite or the like. FIG. 9 illustrates a block diagram of a digital still camera as an example of such an imaging system.

Referring to FIG. 9, the digital still camera includes a barrier 1001 for protection of a lens, a lens 1002 through which an optical image of a photographic subject is focused in an imaging apparatus 1004, and a diaphragm 1003 for adjustment of an amount of light passing through the lens 1002. The imaging apparatus 1004 may be any one of the aforementioned embodiments and converts an optical image focused through the lens 1002 as image data. In this case, an AD converting unit is provided on a semiconductor substrate of the imaging apparatus 1004. The digital still camera further includes a signal processing unit 1007 which may perform a correction on image data output from the imaging apparatus 1004 and compress data. Further referring to FIG. 9, a timing generation unit 1008 outputs a timing signal to the imaging apparatus 1004 and signal processing unit 1007, and a general control unit 1009 generally control over the digital still camera. A frame memory unit 1010 temporarily stores image data. An interface unit 1011 records or reads data to or from a recording medium. A detachable recording medium 1012 may be a semiconductor memory to or from which image data is recorded or read. An interface unit 1013 may be used for communication with an external computer, for example. In this case, a timing signal, for example, may be externally input to the imaging system. The imaging system may have at least the imaging apparatus 1004, and the signal processing unit 1007 which processes an imaging signal output from the imaging apparatus 1004.

According to this embodiment, the imaging apparatus 1004 and an AD converting unit are provided on a same semiconductor substrate. However, the imaging apparatus 1004 and an AD converting unit may be provided on different semiconductor substrates. The imaging apparatus 1004 and the signal processing unit 1007 may be provided on a same substrate.

According to this embodiment, the imaging apparatus 1004 is an imaging apparatus according to any one of the first to fourth embodiments. In this way, application of an embodiment to an imaging system may allow reduce of a noise difference between rows.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-248310 filed Nov. 12, 2012, which is hereby incorporated by reference herein in its entirety.

What is claimed is:

1. An imaging apparatus comprising:
a plurality of unit cells each including a first photoelectric conversion unit, a second photoelectric conversion unit, a first transfer transistor configured to transfer an electric charge in the first photoelectric conversion unit, a second transfer transistor configured to transfer an electric charge in the second photoelectric conversion unit, and at least one transistor shared by the first and second photoelectric conversion units;
a first conductive member electrically connected to gates of the plurality of first transfer transistors;
a second conductive member electrically connected to gates of the plurality of second transfer transistors;
a third conductive member disposed adjacently to the first conductive member in a same wiring layer as the first conductive member and electrically connected to a plurality of nodes each included in respective one of the plurality of unit cells; and
a fourth conductive member disposed adjacently to the second conductive member in a same wiring layer as the second conductive member, wherein
an opposing length of the first conductive member and the third conductive member in a wiring layer having the first and third conductive members is longer than an opposing length of the second conductive member and the fourth conductive member in a wiring layer having the second and fourth conductive members; and
a width W1 of the first conductive member, a distance D1 between the first conductive member and the third conductive member in the wiring layer having the first and third conductive members, a width W2 of the second conductive member and a distance D2 between the second conductive member and the fourth conductive member in the wiring layer having the second and fourth conductive members satisfy a relationship of W1×D1>W2×D2.

2. The imaging apparatus according to claim 1, wherein
a first pair of either a pair of the first and third conductive members or a pair of the second and fourth conductive members is disposed on region between the first photoelectric conversion unit and the second photoelectric conversion unit; and
a second pair of either the pair of the first and third conductive members or the pair of the second and fourth conductive members is disposed on a region between one of the first photoelectric conversion unit and the second photoelectric conversion unit and a third photoelectric conversion unit different from the first photoelectric conversion unit and the second photoelectric conversion unit and adjacent to the one of the first photoelectric conversion unit and the second photoelectric conversion unit.

3. The imaging apparatus according to claim 1, comprising a plurality of wiring layers, wherein the first conductive member and the second conductive member are included in a same wiring layer.

4. The imaging apparatus according to claim 1, wherein
each of the plurality of unit cells includes an amplification transistor; and
the plurality of nodes to which the third conductive member is electrically connected include a power supply node configured to supply a power voltage to the amplification transistor.

5. The imaging apparatus according to claim 1, wherein
each of the plurality of unit cells includes an amplification transistor, and a reset transistor configured to reset a voltage of an input node of the amplification transistor; and
the plurality of nodes to which the third conductive member is electrically connected include a control node of the reset transistor.

6. The imaging apparatus according to claim 1, wherein
each of the plurality of unit cells includes a selection transistor; and
the plurality of nodes to which the third conductive member is electrically connected include a control node of the selection transistor.

7. The imaging apparatus according to claim 1, wherein the fourth conductive member has an island-shape in the same wiring layer.

8. The imaging apparatus according to claim 1, wherein the fourth conductive member configures a wiring for internal electric connection in the unit cell.

9. The imaging apparatus according to claim 1, wherein the fourth conductive member provides electric connection between a conductive member disposed in a wiring layer above the fourth conductive member and a semiconductor region, a gate electrode, or a conductive member disposed in a wiring layer below the fourth conductive member.

10. The imaging apparatus according to claim 1, wherein
a length, along a direction to which the first conductive member extends, of the third conductive member is longer, in the wiring layer having the first and third conductive members, than a pitch between photoelectric conversion units; and
a length, along a direction to which the second conductive member extends, of the fourth conductive member is shorter, in the wiring layer having the first and third conductive members, than the pitch.

11. The imaging apparatus according to claim 1, wherein a ratio between the opposing length L1 of the first conductive member and the third conductive member and the opposing length L2 of the second conductive member and the fourth conductive member satisfies a relationship $L1:L2 = W1 \times D1 : W2 \times D2$.

12. The imaging apparatus according to claim 1, wherein the width W1 of the first conductive member is equal to the width W2 of the second conductive member.

13. The imaging apparatus according to claim 1, wherein the imaging apparatus is a back side illumination type imaging apparatus.

14. The imaging apparatus according to claim 13, wherein
the first to fourth conductive members are disposed on a front side of the imaging apparatus; and
a part of the first to fourth conductive members is disposed at a position to be overlapped with the first or the second photoelectric conversion unit.

15. An imaging apparatus comprising:
a plurality of unit cells each including a first photoelectric conversion unit, a second photoelectric conversion unit, an amplification transistor, a first transfer transistor configured to transfer an electric charge in the first photoelectric conversion unit to an input node of the amplification transistor, and a second transfer transistor configured to transfer an electric charge in the second photoelectric conversion unit to the input node of the amplification transistor;
a first conductive member electrically connected to gates of the plurality of first transfer transistors;
a second conductive member electrically connected to gates of the plurality of second transfer transistors;
a third conductive member disposed adjacently to the first conductive member in a same wiring layer as the first conductive member and electrically connected to a plurality of nodes each included in respective one of the plurality of unit cells; and
a fourth conductive member disposed adjacently to the second conductive member in a same wiring layer as the second conductive member, wherein
an opposing length of the first conductive member and the third conductive member in a wiring layer having the first and third conductive members is longer than an opposing length of the second conductive member and the fourth conductive member in a wiring layer having the second and fourth conductive members; and
a width W1 of the first conductive member, a distance D1 between the first conductive member and the third conductive member in the wiring layer having the first and third conductive members, a width W2 of the second conductive member and a distance D2 between the second conductive member and the fourth conductive member in the wiring layer having the second and fourth conductive members satisfy a relationship of $W1 \times D1 > W2 \times D2$.

16. An imaging apparatus comprising:
a plurality of unit cells each including a first photoelectric conversion unit, a second photoelectric conversion unit, a first transfer transistor configured to transfer an electric charge in the first photoelectric conversion unit, a second transfer transistor configured to transfer an electric charge in the second photoelectric conversion unit, and at least one transistor shared by the first and second photoelectric conversion units;
a first conductive member electrically connected to gates of the plurality of first transfer transistors;
a second conductive member electrically connected to gates of the plurality of second transfer transistors;
a third conductive member disposed adjacently to the first conductive member in a same wiring layer as the first conductive member and electrically connected to a plurality of nodes each included in respective one of the plurality of unit cells; and
a fourth conductive member disposed adjacently to the second conductive member in a same wiring layer as the second conductive member, wherein
an opposing length of the first conductive member and the third conductive member in a wiring layer having the first and third conductive members is longer than an opposing length of the second conductive member and the fourth conductive member in a wiring layer having the second and fourth conductive members;
a width W1 of the first conductive member, a distance D1 between the first conductive member and the third conductive member in the wiring layer having the first and third conductive members, a width W2 of the second conductive member and a distance D2 between the second conductive member and the fourth conductive member in the wiring layer having the second and fourth conductive members satisfy a relationship of $W1 \times D1 > W2 \times D2$; and a distance from the third conductive member to an end of the first conductive member on a side thereof opposite to the third conductive member is longer than a distance from the fourth conductive member to an end of the second conductive member on a side thereof opposite to the fourth conductive member.

17. An imaging system comprising:

the imaging apparatus according to claim 1; and a signal processing apparatus configured to process a signal output from the imaging apparatus.

* * * * *